US006636446B2

United States Patent
Lee et al.

(10) Patent No.: US 6,636,446 B2
(45) Date of Patent: Oct. 21, 2003

(54) SEMICONDUCTOR MEMORY DEVICE HAVING WRITE LATENCY OPERATION AND METHOD THEREOF

(75) Inventors: Chan-Yong Lee, Suwon (KR); Jung-Bae Lee, Suwon (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 10/154,734

(22) Filed: May 24, 2002

(65) Prior Publication Data

US 2003/0026138 A1 Feb. 6, 2003

(30) Foreign Application Priority Data

Aug. 1, 2001 (KR) ..................................... 2001-0046632

(51) Int. Cl.$^7$ ................................................. G11C 7/00
(52) U.S. Cl. .................. 365/194; 365/233; 365/230.08; 365/189.12
(58) Field of Search ................................. 365/194, 233, 365/230.08, 189.12, 236, 241, 193

(56) References Cited

U.S. PATENT DOCUMENTS 5,544,124 A * 8/1996 Zagar et al. ........... 365/230.08

* cited by examiner

*Primary Examiner*—David Lam
(74) *Attorney, Agent, or Firm*—F. Chau & Associates, LLP

(57) ABSTRACT

A semiconductor memory device capable of improving common bus efficiency is disclosed. The device comprises an address shifting circuit for delaying an address by an n+m number of clock cycles in response to a clock signal, a control signal generating circuit for combining a column address strobe (CAS) latency of n-value and one of first and second operation signals to generate a control signal, and a switching circuit for outputting the address delayed by the n+m number of clock cycles output from the address shifting circuit in response to the control signal. The first operation signal indicates that the n-value of the CAS latency is less than a predetermined value and write latency is fixed. The second operation signal indicates that the n-value of the CAS latency is equal to or greater than the predetermined value and the write latency is variable.

23 Claims, 5 Drawing Sheets

SEMICONDUCTOR MEMORY DEVICE HAVING WRITE LATENCY OPERATION AND METHOD THEREOF

CROSS-REFERENCE TO RELATED APPLICATION

This application claims priority to Korean Patent Application No. 2001-46632 filed on Aug. 1, 2001.

BACKGROUND

1. Technical Field

The present invention relates to a semiconductor memory device, and more particularly, to a semiconductor memory device capable of performing a write latency operation.

2. Description of Related Art

A semiconductor memory device such as a synchronous dynamic random access memory device (SDRAM) or a double data rate synchronous dynamic random access memory device (DDR SDRAM) supports a write latency operation, wherein data is written in the memory device after a predetermined clock cycle is lapsed from receiving a write command. For example, if write latency is "1", data is written after one clock cycle is lapsed from receiving a write command, and if the write latency is "3", data is written after three clock cycles are lapsed from receiving the write command.

When an apparatus includes a semiconductor memory device having fixed write latency, the efficiency of the command bus of the apparatus is decreased. There are semiconductor memory devices having a variable write latency, wherein a write latency value is varied with or without a column address strobe (CAS) latency. For example, when an apparatus has a relatively low operation frequency, i.e., CAS is less than 3, a burst stop can be used and a semiconductor memory device having a write latency to a fixed value will achieve high bus efficiency. On the other hand, when an apparatus has a relatively high operation frequency, i.e., CAS is greater than 2, the burst stop cannot be used and a semiconductor memory device having a write latency set to a variable value will achieve high bus efficiency.

Accordingly, a need exists for a semiconductor memory device that can set write latency to a fixed value or a variable value based on CAS latency to achieve high bus efficiency of an apparatus employing the semiconductor memory device.

SUMMARY OF THE INVENTION

It is an object of the present invention to provide a semiconductor memory device capable of improving command bus efficiency and method thereof.

According to an aspect of the present invention, a semiconductor memory device comprises an address shifting circuit for delaying an address by an n+m number of clock cycles in response to a clock signal, a control signal generating circuit for combining a column address strobe (CAS) latency of n-value and one of first and second operation signals to generate a control signal, wherein the first operation signal indicates that the n-value of the CAS latency is less than a predetermined value and write latency is fixed, wherein the second operation signal indicates that the n-value of the CAS latency is equal to or greater than the predetermined value and the write latency is variable, and a switching circuit for outputting the address delayed by the n+m number of clock cycles output from the address shifting circuit in response to the control signal.

According to another aspect of the present invneiton, a method is provided for controlling a write latency operation of a semiconductor memory device comprising the stesp of delaying an address by n+m clock cycles in response to a clock signal, generating a first control signal by combining a column address strobe (CAS) latency signal of n-value and a first operation signal, when the n-value of the CAS latency is less than a predetermined value and write latency is fixed, generating a second control signal by combining the column address strobe (CAS) latency of n-value and a second operation signal, when the n-value of the CAS latency is eqaul to or greater than the predetermined value and the write latency is variable, and outputting the address delayed by the n+m clock cycles in response to corresponding one of the first and second control signal.

According to another aspect of the present invneiton, a semiconductor memory device comprises an address shifting circuit for shifting an address by a predetermined number of clock cycles to generate a plurality of delayed addresses, in response to a clock signal, a control signal generating circuit for combining column address strobe (CAS) latency and one of first and second operation signals based on a value of the CAS latency to generate a control signal, and a switching circuit for selecting one of the delayed addresses output from the address shifting circuit in response to the control signal.

According to further aspect of the present invention, a method is provided for controlling a write latency operation of a semiconductor memory device comprising the steps of shifting an address by a predetermined number of clock cycles to generate a plurality of delayed addresses, in response to a clock signal, generating a control signal by combining column address strobe (CAS) latency and one of first and second operation signals based on a value of the CAS latency, and selecting one of the delayed addresses in response to the control signal.

These and other aspects, features, and advantages of the present invention will become apparent from the following detailed description of preferred embodiments, which is to be read in conjunction with the accompanying figures.

DETAILED DESCRIPTION OF PREFFERED EMBODIMENTS

Figure 1:
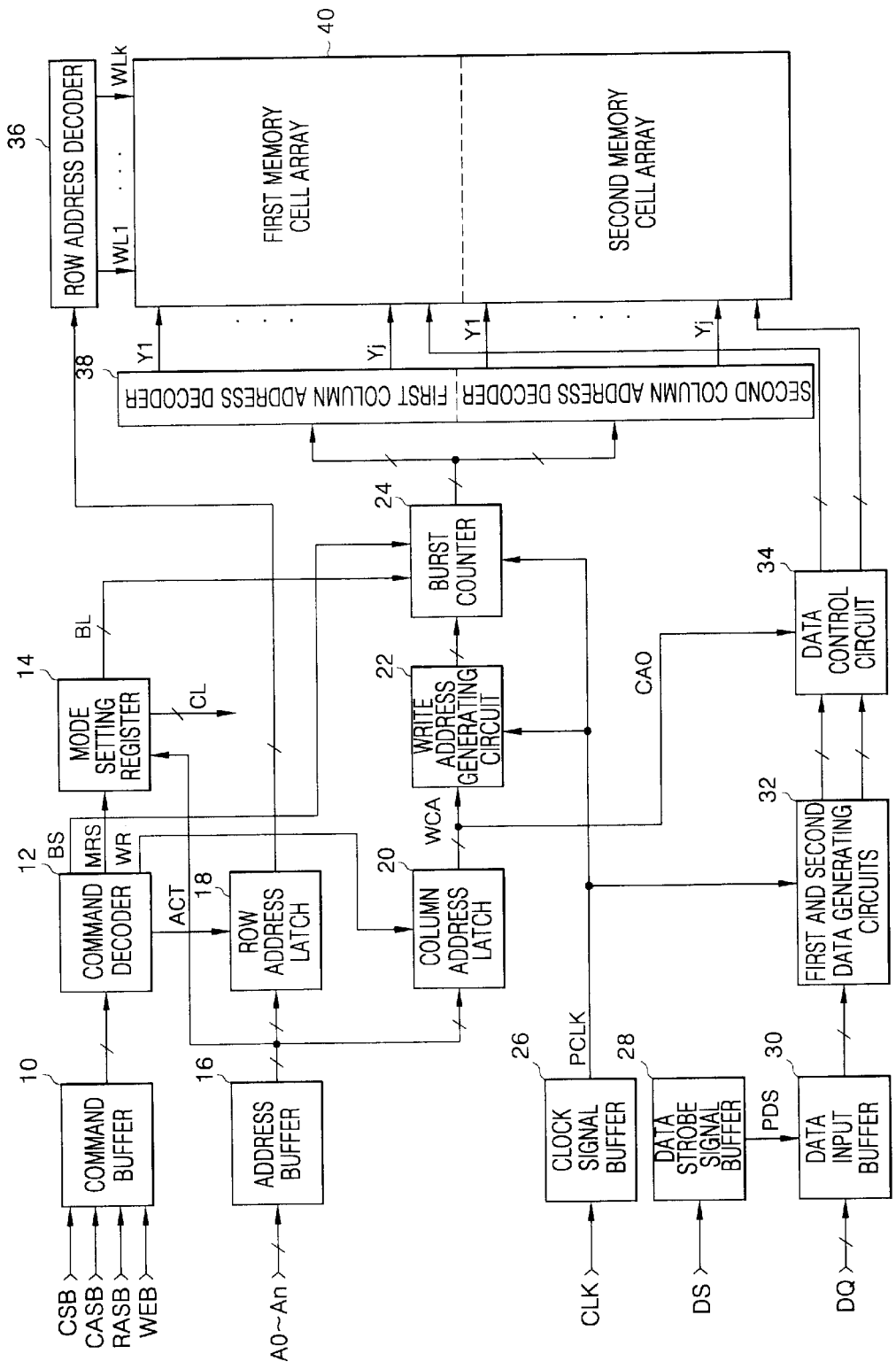
FIG. 1 is a block diagram illustrating a conventional double data rate synchronous dynamic random access memory device.

FIG. 1 is a block diagram illustrating a conventional double data rate synchronous dynamic random access memory device (DDR SDRAM). Signals and components, shown in FIG. 1, are mainly for illustrating a write operation of a conventional semiconductor memory device, in particular, a 2-bit pre-fetch operation.

The semiconductor memory device of FIG. 1 comprises a command buffer 10, a command decoder 12, a mode setting register 14, an address buffer 16, a row address latch 18, a column address latch 20, a write address generating circuit 22, a burst counter 24, a clock signal buffer 26, a data strobe signal buffer 28, a data input buffer 30, first and second data generating circuits 32, a data control circuit 34, a row address decoder 36, first and second column address decoders 38, and first and second memory cell arrays 40.

The command buffer 10 buffers external commands such as an inverted chip selecting signal (CSB), an inverted column address strobe signal (CASB), an inverted row address strobe signal (RASB), and an inverted write enable signal (WEB). The command decoder 12 decodes the signals output from the command buffer 10 to generate an active command (ACT), a mode setting command (MRS), a write command (WR), a read command (RD), and a burst stop command (BS). The mode setting register 14 stores data output from the address buffer 16 to generate a column address strobe (CAS) latency signal (CL) and a burst length signal (BL) in response to the mode setting command (MRS).

The address buffer 16 buffers external addresses A0 to An. The row address latch 18 latches the signal output from the address buffer 16 in response to the active command (ACT). The column address latch 20 latches the signal output from the address buffer 16 in response to the write command (WR). The write address generating circuit 22 delays a write column address (WCA) output from the column address latch 20 by a predetermined clock cycle and outputs the delayed write column address (WCA). The burst counter 24 receives the signal output from the write address generating circuit 22 and performs counting as many as a burst length in response to the burst length signal (BL). The burst counter 24 finishes counting in response to the burst stop command (BS) that is delayed by the CAS latency.

The clock signal buffer 26 buffers an external clock signal (CLK) to generate a buffered clock signal (PCLK). The data strobe buffer 28 buffers an external data strobe signal (DS) to generate a buffered data strobe signal (PDS). The data input buffer 30 buffers and outputs external data in response to a rising transition and a falling transition of the buffered data strobe signal (PDS). At this moment, 2-bit data is input to the data input buffer 30 within one clock cycle through respective data I/O pins, thereby prefetching the 2-bit data.

The first and second data generating circuits 32 convert the 2-bit data sequentially output from the data input buffer 30 to 2-bit data in parallel in response to the buffered clock signal (PCLK). The data control circuit 34 controls the sequence of the 2-bit data in response to a least significant bit column address (CA0) outputted from the column address latch 20. When the least significant bit address (CA0) is "0", the data control circuit 34 outputs the 2-bit data output from the first and second data generating circuits 32 "as is". When the least significant bit address (CA0) is "1", the data control circuit 34 changes the sequence of the 2-bit data output from the first and second data generating circuit 32 and outputs the 2-bit data according to the changed sequence.

The row address decoder 36 decodes the data output from the row address latch 18 to select one word line among a k-number of word lines WL1~WLk. The first and second column address decoders 38 decode the column addresses output from the burst counter 24 to generate one column selecting signal among a j-number of column selecting signals Y1~Yj, respectively. The first and second memory cell arrays 40 simultaneously store data output from the data control circuit 34, respectively.

The semiconductor memory device of FIG. 1 sets write latency to a fixed value and uses a burst stop command (BS) when CAS latency is less than 3.

Figure 2A:
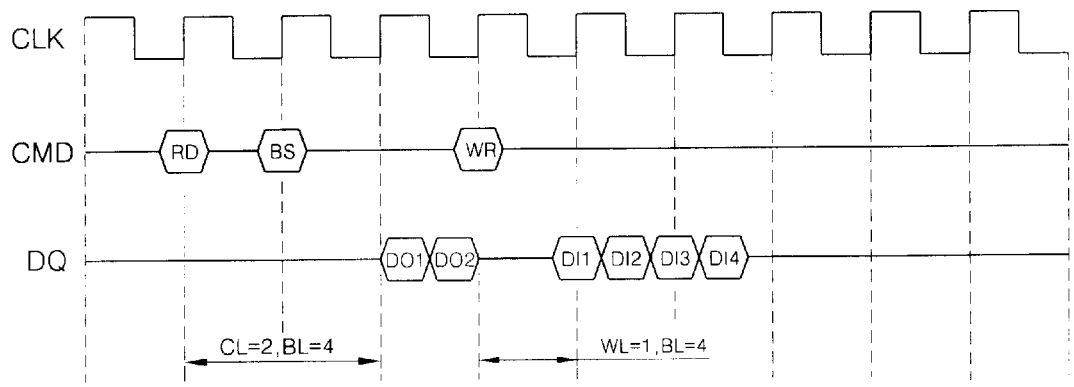
FIGS. 2A–B and 3A–B are timing diagrams illustrating read and write operations of the semiconductor memory device of FIG. 1.

FIG. 2A is a timing diagram illustrating read and write operations of the semiconductor memory device of FIG. 1 wherein the CAS latency is two and the burst length is fixed to four and a gap between output data and input data is one clock cycle. In FIG. 2A, CLK denotes a clock signal, CMD denotes command signals, and DQ denotes read data or a write data.

Referring to FIG. 2A, when the semiconductor memory device receives the read command (RD) and the burst stop command (BS) after one clock cycle from receiving the read command (RD), the device outputs data DO1 and DO2 after two clock cycles from receiving the read command (RD). The generation of the output data is stopped by the burst stop command (BS). When the device receives the write command (WR) after three clock cycles from receiving the read command (RD), data DI1~DI4 is input in the device after one clock cycle from receiving the write command (WR).

Figure 2B:
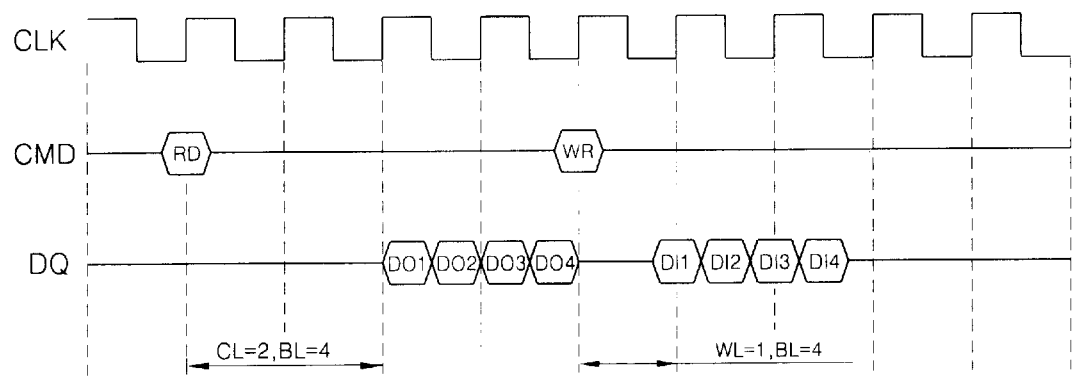

FIG. 2B is a timing diagram illustrating read and write operations of the semiconductor memory device of FIG. 1 wherein the write latency value is variable (that is, the write latency is the CAS latency minus 1), and the burst stop command (BS) is not used. In FIG. 2B, the CAS latency is two, the burst length is four, and the gap between an input data and an output data is one clock cycle.

Referring to FIG. 2B, after two clock cycles from receiving the read command (RD), the semiconductor memory device outputs data DO1~DO4. The write command (WR) is applied to the device after four clock cycles from applying the read command (RD). Because the write latency is one, data DI1~DI4 is input in the device after one clock cycle from applying the write command (WR).

When the semiconductor memory device of FIG. 1 has the CAS latency of two and the write latency WL of one, and uses the burst stop command (BS), as shown in FIG. 2A, the write command (WR) can be applied to the device after three clock cycles from applying the read command (RD). On the other hands, when the semiconductor memory device has the CAS latency of two, the variable write latency WL, and does not use the burst stop command (BS), as shown in FIG. 2B, the write command (WR) can be applied to the device after four clock cycles from applying the read command (RD). As a result, the semiconductor memory device of FIG. 2A has higher bus efficiency than that of FIG. 2B.

Figure 3A:
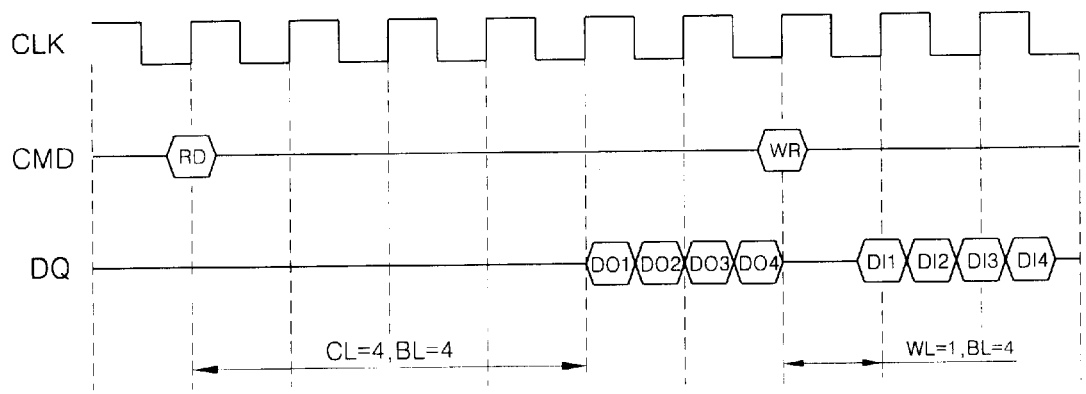

FIG. 3A is a timing diagram illustrating read and write operations of the semiconductor memory device of FIG. 1 wherein the CAS latency is four, the burst length is four, the write latency WL is fixed to one, and the gap between input data and output data is one clock cycle.

When the read command (RD) is applied to the device at a rising edge of the clock signal (CLK), output data DO1~DO4 are sequentially output in response to rising and falling edges of the clock signal (CLK) after four clock cycles from applying the read command (RD). When the write command (WR) is applied to the device, input data DI1~DI4 are sequentially generated in response to rising and falling edges of the clock signal (CLK) after one clock cycle from applying the write command (WR).

When the semiconductor memory device of FIG. 1 has the CAS latency of four, the burst length of four, and the write latency of one, the write command (WR) can be applied to the device after six clock cycles from applying the read command (RD).

Figure 3B:
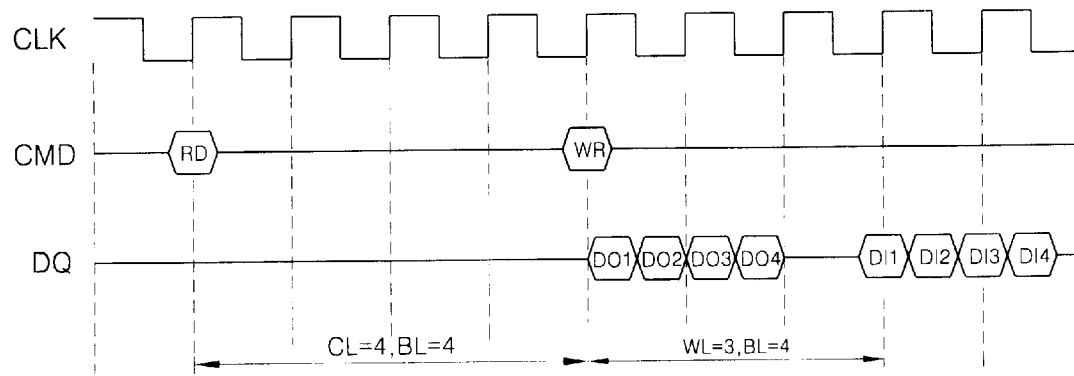

FIG. 3B is a timing diagram illustrating read and write operations of the semiconductor memory device of FIG. 1 wherein the write latency value is variable, the CAS latency is four, the burst length is four, and the gap between input data and output data is one clock cycle. Here, the CAS latency minus 1 is the write latency value.

The output data DO1~DO4 are generated from the device after four clock cycles from applying the read command (RD). Since the write latency is three and the gap between the input data and the output data is one clock cycle, the write command (WR) can be applied to the device after four clock cycles from applying the read command (RD). The input data DI1~DI4 are input to the device after three clock cycles from applying the write command (WR).

When the conventional semiconductor memory device, as shown in FIG. 3A, has the write latency WL of one, the read command (RD) is applied to the device after six clock cycles from applying the write command (WR). On the other hands, when the conventional semiconductor memory device, as shown in FIG. 3B, has the variable write latency based on the CAS latency, the read command signal (RD) can be applied to the device after four clock cycles from applying the write command signal (WR). Thus, the semiconductor memory device of FIG. 3B has higher bus efficiency that that of FIG. 3A.

As described above, to achieve high bus efficiency, when a semiconductor memory device is incorporated in an apparatus having a relatively low operation frequency, it is preferable for the device to have CAS latency less than 3, a fixed write latency value and use a burst stop command. Alternatively, to achieve high bus efficiency, when the apparatus has a relatively high operation frequency, it is preferable for the semiconductor memory device to have CAS latency value of 3 or greater, a variable write latency value, and not to use a burst stop command.

Figure 4:
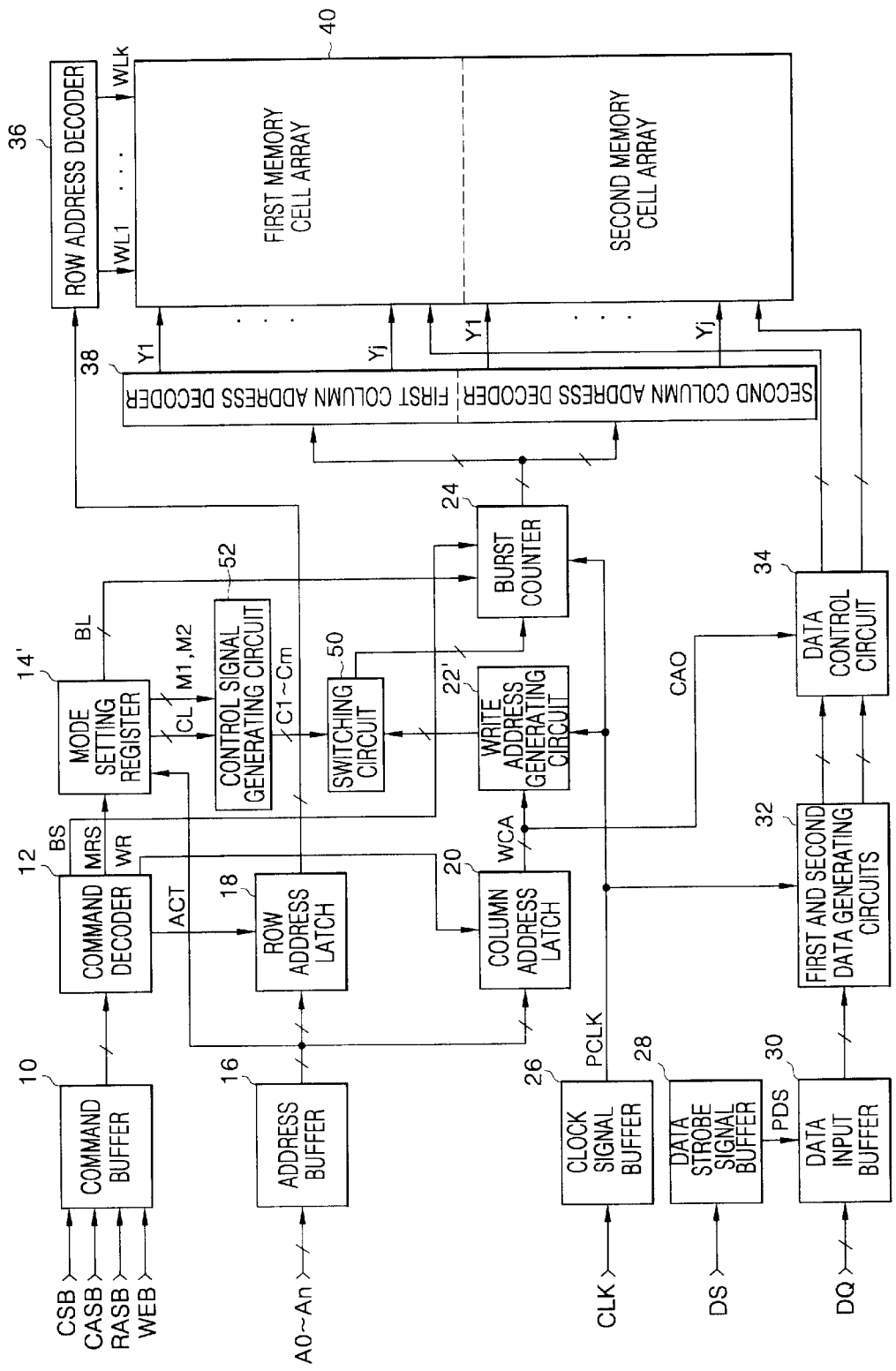
FIG. 4 is a block diagram illustrating a double data rate synchronous dynamic semiconductor memory device according to an embodiment of the present invention.

FIG. 4 is a block diagram illustrating a double data rate synchronous dynamic semiconductor memory device (DDR SDRAM) according to an embodiment of the present invention. The semiconductor memory device of FIG. 4 further comprises a switching circuit 50 and a control signal generating circuit 52 in addition to the components of the semiconductor memory device of FIG. 1, and comprises a mode setting register 14' and a write address generating circuit 22' instead of the mode setting register 14 and the write address generating circuit 22 of the semiconductor memory device of FIG. 1.

The mode setting register 14' receives and stores a CAS latency signal (CL), a burst length signal (BL), a first operation signal (M1), and a second operation signal (M2) from an address buffer 16 in response to a mode setting command (MRS). The mode setting register 14' of FIG. 4 stores the first and second operation signals (M1 and M2) in addition to the CAS latency signal (CL) and the burst length signal (BL), while the mode setting register 14 of FIG. 1 stores the CAS latency signal (CL) and the burst length signal (BL).

Here, the first operation signal (M1) indicates that a semiconductor memory device operates as a first type semiconductor memory device having CAS latency CL less than 3, fixed write latency WL and using a burst stop command. The second operation signal (M2) indicates that a semiconductor memory device operates as a second type semiconductor memory device having CAS latency CL of 3 or greater, variable write latency WL based on the CAS latency, and not using a burst stop command.

The control signal generating circuit 52 generates control signals (C1~Cm) to control the write latency based on the CAS latency and the first and second operation signals (M1 and M2). For instance, the control signals (C1~Cm) control the write latency WL to have a fixed value when the CAS latency is less than three and the first operation signal (M1) is generated. The control signals (C1~Cm) control the write latency WL to have a variable value when the CAS latency is 3 or greater and the second operation signal (M2) is generated.

The switching circuit 50 outputs an output signal of the write address generating circuit 22' to a burst counter 24 in response to the control signals (C1~Cm).

The write address generating circuit 22' shifts a write column address (WCA) output from a write address latch 20 to output a delayed write column address (WCA) in response to a clock signal (PCLK). The write address generating circuit 22' of FIG. 4 shifts the write column address (WCA) by variable write latency, i.e., the variable number of clock cycles based on the CAS latency CL, while the write address generating circuit 22 of FIG. 1 shifts the write column address (WCA) by fixed write latency, i.e., the fixed number of clock cycles.

Figure 5:
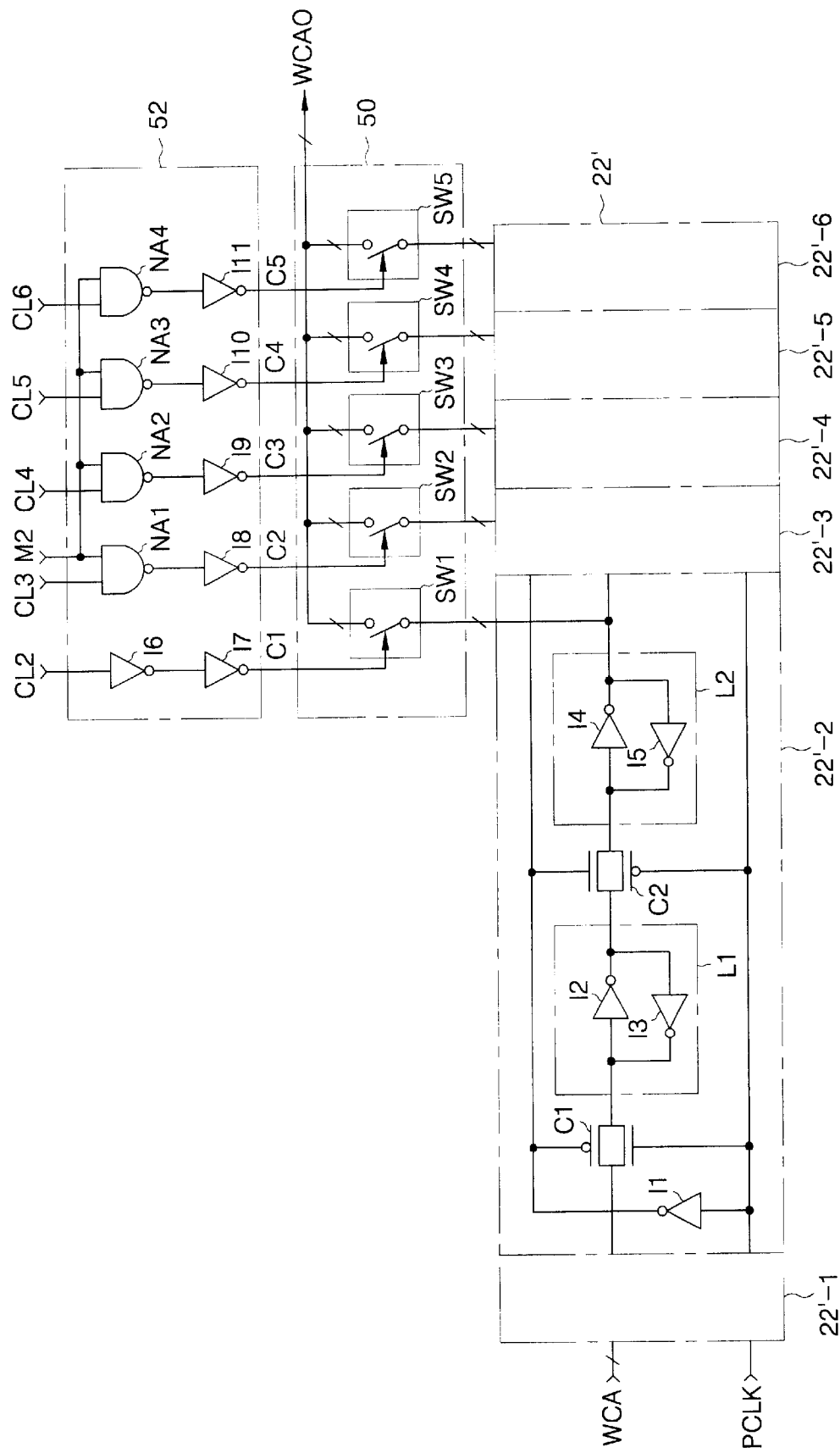
FIG. 5 is a circuit diagram of a write address generating circuit, a switching circuit, and a control signal generating circuit, according to embodiments of the present invention.

FIG. 5 is a circuit diagram illustrating preferred embodiments of the write address generating circuit 22', the switching circuit 50, and the control signal generating circuit 52 of FIG. 4 wherein the write latency WL is varied from 1 to 5. Here, the CAS latency minus 1 is the write latency.

In FIG. 5, the write address generating circuit 22' comprises a plurality of 1-bit registers 22'-1~22'-6 to shift a write column address (WCA) in response to the clock signal (PCLK). Each 1-bit register comprises an inverter I1, CMOS transmission gates C1 and C2, a latch L1 comprising inverters I2 and I3, and a latch L2 comprising inverters I4 and I5, and shifts the write column address (WCA) by one clock cycle. At the 1-bit register 22'-6, the write column address (WCA) is shifted by six clock cycles, i.e., delayed by six clock cycles. The switching circuit 50 comprises a plurality of switches SW1~SW5, all the switches are turned on in response to corresponding control signals (C1~C5) respectively. The control signal generating circuit 52 comprises a plurality of inverters I6~I11 and a plurality of NAND gates NA1~NA4.

The write address generating circuit 22' shifts the write column address (WCA) by a range of between two clock cycles and six clock cycles, in response to the clock signal (PCLK). For instance, the write column address (WCA) is shifted by two clock cycles by two 1-bit registers 22'-1 and 22'-2, and the write column address (WCA) is shifted by six clock cycles by six 1-bit registers 22'-1~22'-6. The shifted write column address (WCA) is output through one of switches SW1~SW5 connected to a corresponding one of the 1-bit registers 22'-2~22'-6, as a write column output address (WCAO). Each of the switches SW1~SW5 of the switching circuit 50 is turned on in response to a corresponding one of the control signals (C1~C5) to output the shifted write column address (WCA) as the write column output address (WCAO).

The control signal generating circuit 52 generates the control signals (C2–C5) in response to the CAS latency CL of 3 or greater and the second operation signal (M2), and generates a control signal (C1) in response to the CAS latency CL less than 3. For example, the inverters I6 and I7 generate the control signal (C1) in response to the CAS latency signal (CL2). The NAND gate NA1 and the inverter I8 generate the control signal (C2) in response to the CAS latency (CL3) and the second operation signal (M2), the NAND gate NA2 and the inverter I9 generate the control signal (C3) in response to the CAS latency signal (CL4) and the second operation signal (M2), the NAND gate NA3 and the inverter I10 generate the control signal (C4) in response to the CAS latency signal (CL5) and the second operation signal (M2), and the NAND gate NA4 and the inverter I11 generate the control signal (C5) in response to the CAS latency signal (CL6) and the second operation signal (M2).

When the control signal (C1) is generated, the switch SW1 is turned on to output the write column address (WCA) delayed by two clock cycles using the 1-bit registers 22'-1 and 22'-2 as the write column output address (WCAO). When the control signal (C2) is generated, the switch SW2 is turned on to output the write column address (WCA) delayed by three clock cycles using three 1-bit registers 22'-1~22'-3 as the write column output address (WCAO). Similarly, when the control signal (C5) is generated, the switch SW5 is turned on to output the write column address (WCA) delayed by six clock cycles using six 1-bit registers 22'-1~22'-6 as the write column output address (WCAO).

When the CAS latency CL is 2, the write column address (WCA) delayed by two clock cycles is output as the write column output address (WCAO), regardless of which operation signal (M1 or M2) is generated.

In summary, a semiconductor memory device according to the invention is configured to operate as a first type semiconductor memory device or a second type semiconductor memory device in a package state based on CAS latency applied to a mode setting register. Further, according to another embodiment of the present invention, a semiconductor memory device can be configured to operate as one of the first and second type semiconductor memory devices by controlling a operation signal such as a first or second operation signal (M1 or M2) using a fuse option or a metal option.

Advantageously, a semiconductor memory device according to an embodiment of the present invention can achieve high command bus efficiency by operating as both a first type semiconductor memory device having fixed write latency and a second type semiconductor memory device having variable write latency. For example, a semiconductor memory device operates as the second type semiconductor memory device in response to a second operation signal (M2), when CAS latency CL is 3 or greater, write latency value is variable. Alternatively, the semiconductor memory device operates as the first type semiconductor memory device in response to a first operation signal (M1), when the CAS latency CL is less than 3, the write latency value is a fixed value, and a bus stop command is used.

While the invention has been particularly shown and described with reference to preferred embodiments thereof, it will be understood by those skilled in the art that the foregoing and other changes in form and details may be made therein without departing from the spirit and scope of the invention.

What is claimed is:

1. A semiconductor memory device, comprising:
   an address shifting circuit for delaying an address by an n+m number of clock cycles in response to a clock signal;
   a control signal generating circuit for combining a column address strobe (CAS) latency of n-value and one of first and second operation signals to generate a control signal, wherein the first operation signal indicates that the n-value of the CAS latency is less than a predetermined value and write latency is fixed, wherein the second operation signal indicates that the n-value of the CAS latency is equal to or greater than the predetermined value and the write latency is variable; and
   a switching circuit for outputting the address delayed by the n+m number of clock cycles output from the address shifting circuit in response to the control signal.

2. The device of claim 1, further comprising a mode setting register for storing the n-value of the CAS latency and the first and second operation signals and for outputting the signals to the control signal generating circuit in response to a mode setting command.

3. The device of claim 1, further comprising:
   a mode setting register for storing and outputting the n-value of the CAS latency in response to a mode setting command; and
   a program circuit for programming the first and second operation signals.

4. The device of claim 1, wherein the address comprises a column address.

5. The device of claim 1, wherein the write latency is determined by substracting a value one from the CAS latency.

6. A method for controlling a write latency operation of a semiconductor memory device, comprising the steps of:
   delaying an address by n+m clock cycles in response to a clock signal;
   generating a first control signal by combining a column address strobe (CAS) latency signal of n-value and a first operation signal, when the n-value of the CAS latency is less than a predetermined value and write latency is fixed;
   generating a second control signal by combining the column address strobe (CAS) latency of n-value and a second operation signal, when the n-value of the CAS latency is equal to or greater than the predetermined value and the write latency is variable; and
   outputting the address delayed by the n+m clock cycles in response to a corresponding one of the first and second control signal.

7. The method of claim 6, further comprising the step of receving the column address strobe (CAS) latency and the first and second operation signals in response to a mode setting command.

8. The method of claim 6, further comprising the steps of:
   receiving the CAS latency from an outside in response to a mode setting command; and
   programming the first and second operation signals.

9. The method of claim 6, wherein the address comprises a column address.

10. The method of claim 6, further comprising the step of determining the write latency by substracting a value one from the CAS latency.

11. A semiconductor memory device, comprising:
    an address shifting circuit for shifting an address by a predetermined number of clock cycles to generate a plurality of delayed addresses, in response to a clock signal;
    a control signal generating circuit for combining column address strobe (CAS) latency and one of first and second operation signals based on a value of the CAS latency to generate a control signal; and
    a switching circuit for selecting one of the delayed addresses output from the address shifting circuit in response to the control signal.

12. The device of claim 11, wherein the control signal generating circuit combines the CAS latency and the first operation signal when the value of the CAS latency is less than a predetermined value.

13. The device of claim 12, wherein the semiconductor memory device uses a burst stop command signal to perform the write latency operation.

14. The device of claim 12, wherein the predetermined value of the CAS latency is three.

15. The device of claim 12, wherein the switching circuit selects the address delayed by a number of clock cycles corresponding to fixed write latency.

16. The device of claim 11, wherein the control signal generating circuit combines the CAS latency and the second operation signal when the value of CAS latency is equal to or greater than a predeteremined value.

17. The device of claim 16, wherein the switching circuit selects the address delayed by a number of clock cycles corresponding to variable write latency.

18. The device of claim 11, wherein the address shifting curcuit comprises a plurality of 1-bit registers for shifting the address by one clock cycle, in response to the clock signal.

19. A method for controlling a write latency operation of a semiconductor memory device, comprising the steps of:

shifting an address by a predetermined number of clock cycles to generate a plurality of delayed addresses, in response to a clock signal;

generating a control signal by combining column address strobe (CAS) latency and one of first and second operation signals based on a value of the CAS latency; and selecting one of the delayed addresses in response to the control signal.

20. The method of claim 19, wherein the step of generating a control signal comprises the steps of:

combining the CAS latency and the first operation signal when the CAS latency is less than a predetermined value; and combining the CAS latency and the second operation signal when the CAS latency is equal to or greater than the predetermined value.

21. The method of claim 20, wherein the step of selecting one of the delayed addresses comprises the steps of:

selecting the address delayed by the number of clock cycles corresponding to fixed write latency when the CAS latency is less than the predetermined value; and selecting the address delayed by the number of clock cycles corresponding to variable write latency when the CAS latnecy is equal to or greater than the predetermined vlaue.

22. The method of claim 21, wherein the step of selecting one of the delayed addresses further comprises the step of determining the variable write latency by substracting a value one from the value of the CAS latency.

23. The method of claim 21, wherein the predetermined value of the CAS latency is 3.

* * * * *